United States Patent [19]
Kawakami

[11] Patent Number: 5,777,520
[45] Date of Patent: Jul. 7, 1998

[54] HORIZONTAL OSCILLATION CIRCUIT CAPABLE OF CHANGING FREQUENCY

[75] Inventor: Takaaki Kawakami, Kamakura, Japan

[73] Assignee: Kabushiki Kaisha Toshiba, Kawasaki, Japan

[21] Appl. No.: 722,460

[22] Filed: Sep. 27, 1996

[30] Foreign Application Priority Data

Sep. 28, 1995 [JP] Japan .................. 7-250552

[51] Int. Cl.$^6$ .............. H03L 7/00; H03L 7/099; G09G 1/04
[52] U.S. Cl. .............. 331/1 R; 331/11; 331/20; 331/34; 331/57; 331/74; 331/179; 315/399; 327/156; 327/158; 348/540
[58] Field of Search ............. 331/11, 14, 17, 331/20, 34, 57, 74, 179, 1 R, 1 D; 315/399; 327/156–159; 548/537, 540, 543–545

[56] References Cited

U.S. PATENT DOCUMENTS 4,634,939  1/1987  Dietz .................. 515/399
5,389,898  2/1995  Taketoshi et al. .......... 331/57 X
5,399,995  3/1995  Kardontchik et al. ........ 331/57 X

*Primary Examiner*—David Mis
*Attorney, Agent, or Firm*—Oblon, Spivak, McClelland, Maier & Neustadt, P.C.

[57] ABSTRACT

A frequency detection circuit detects the frequency of a horizontal sync signal, and generates a mode switching signal corresponding to the detected frequency. A voltage-controlled oscillator constituting a PLL circuit has a plurality of oscillation modes obtained by dividing a frequency equal to an integer multiple of the frequency of the horizontal sync signal into a plurality of frequency ranges, and oscillates signals in the respective frequency ranges in accordance with control voltages output from a filter. The oscillation modes of the voltage-controlled oscillator are switched in accordance with the mode switching signal output from the frequency detection circuit. In the voltage-controlled oscillator, since the frequency range in each oscillation mode is narrow, the oscillation gain can be suppressed low, and a deterioration in jitter characteristics can be prevented.

23 Claims, 6 Drawing Sheets

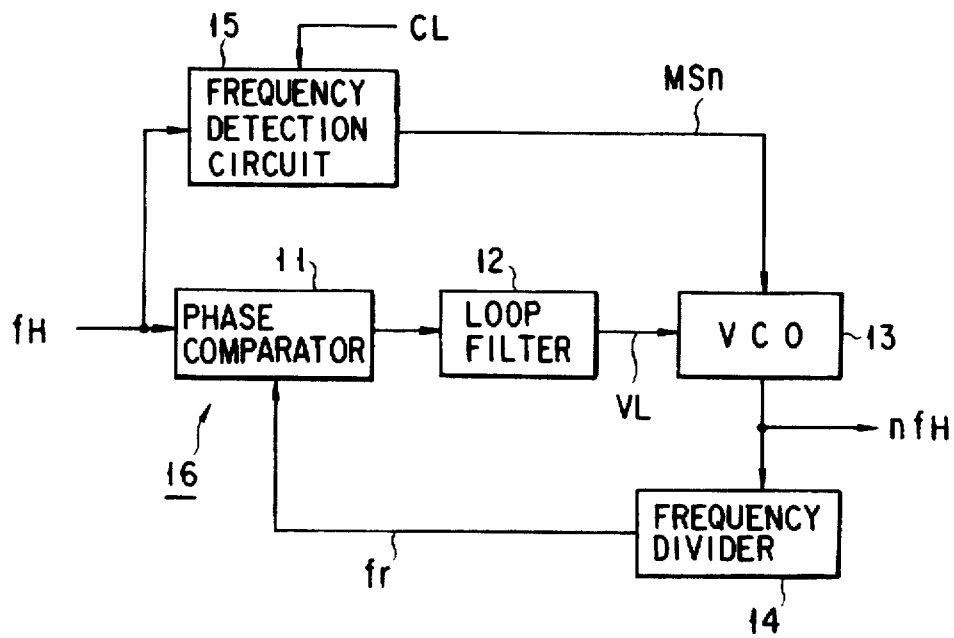
F I G. 1
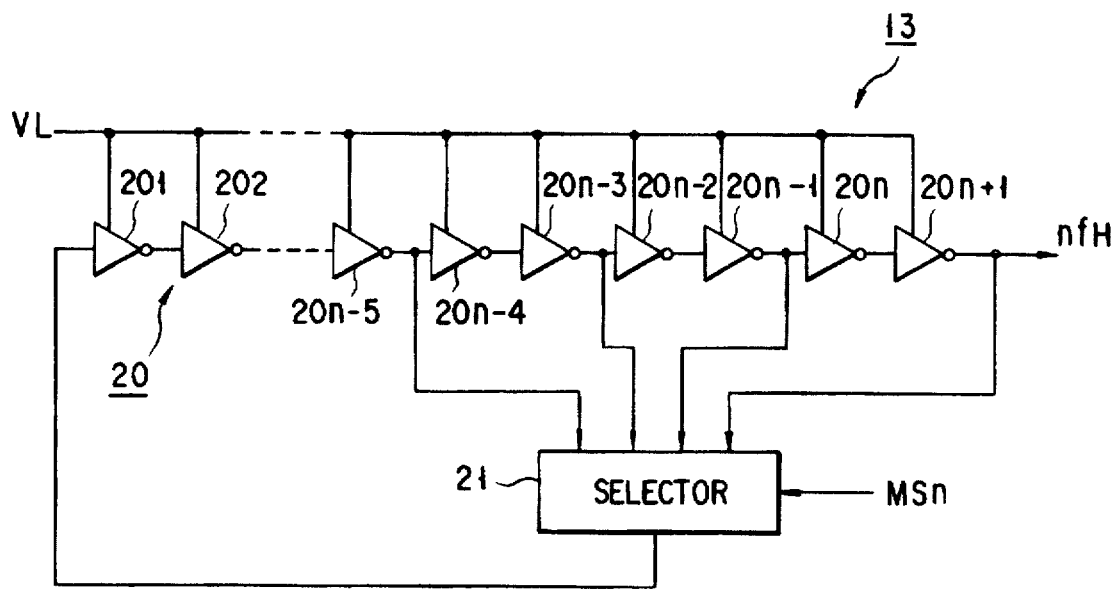
F I G. 2

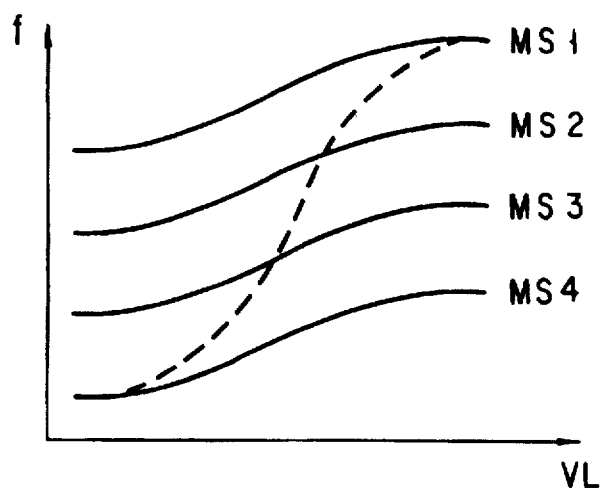
F I G. 3
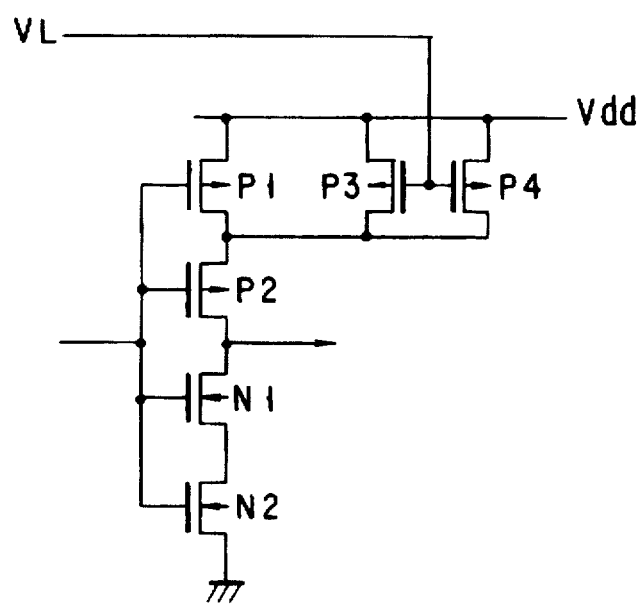
F I G. 4

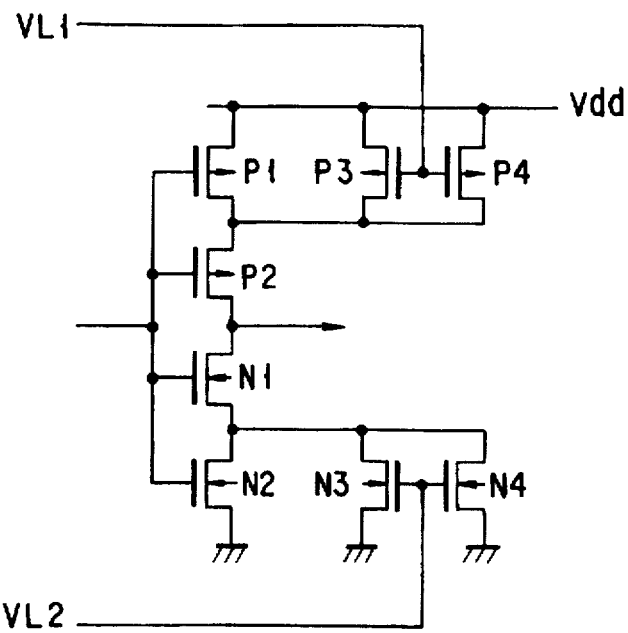
F I G. 5
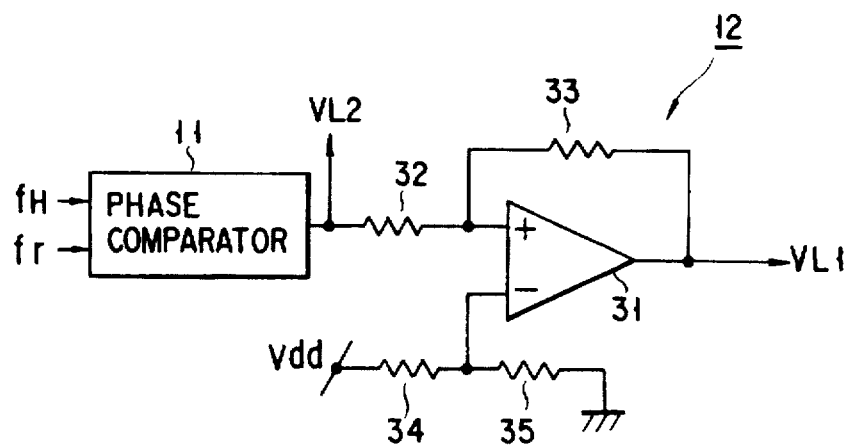
F I G. 6

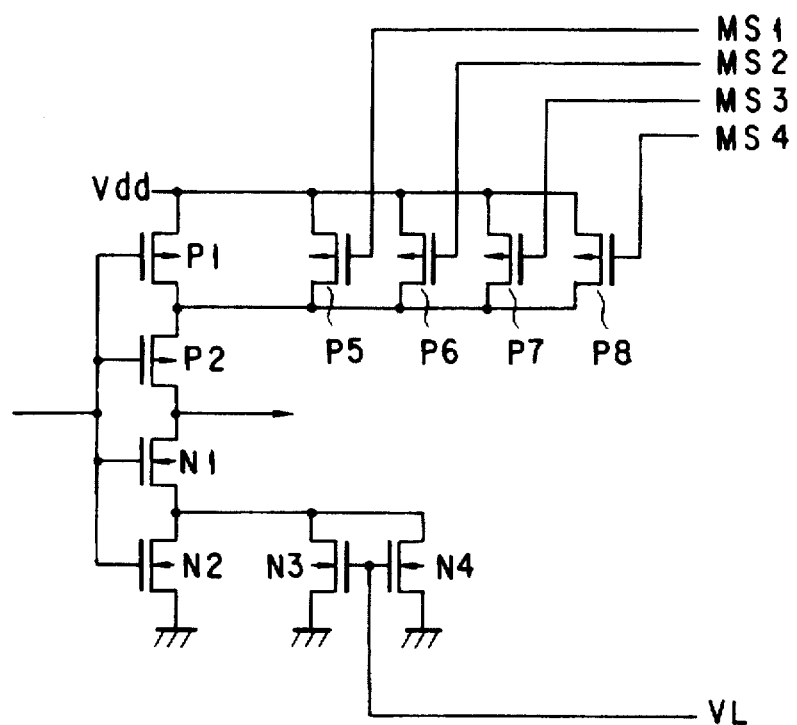
F I G. 7
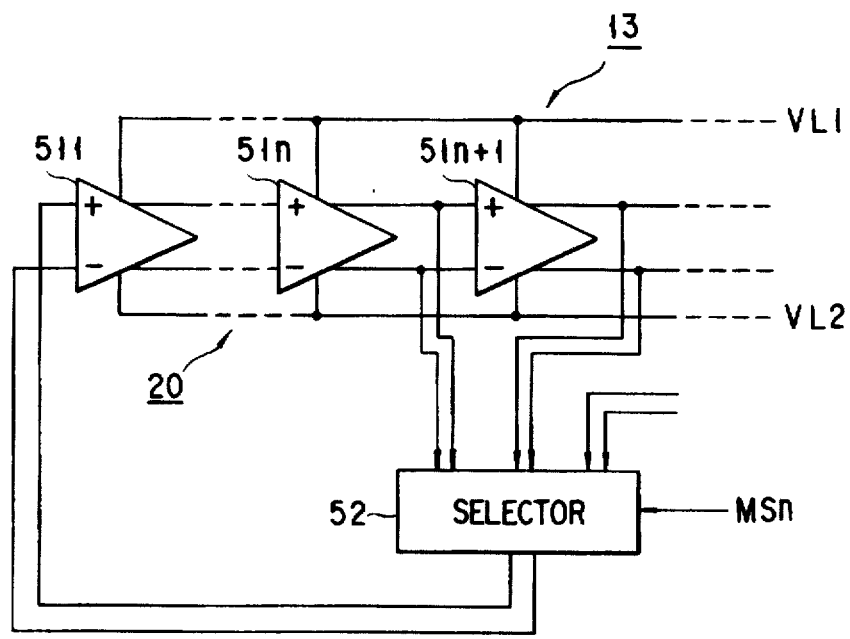
F I G. 8

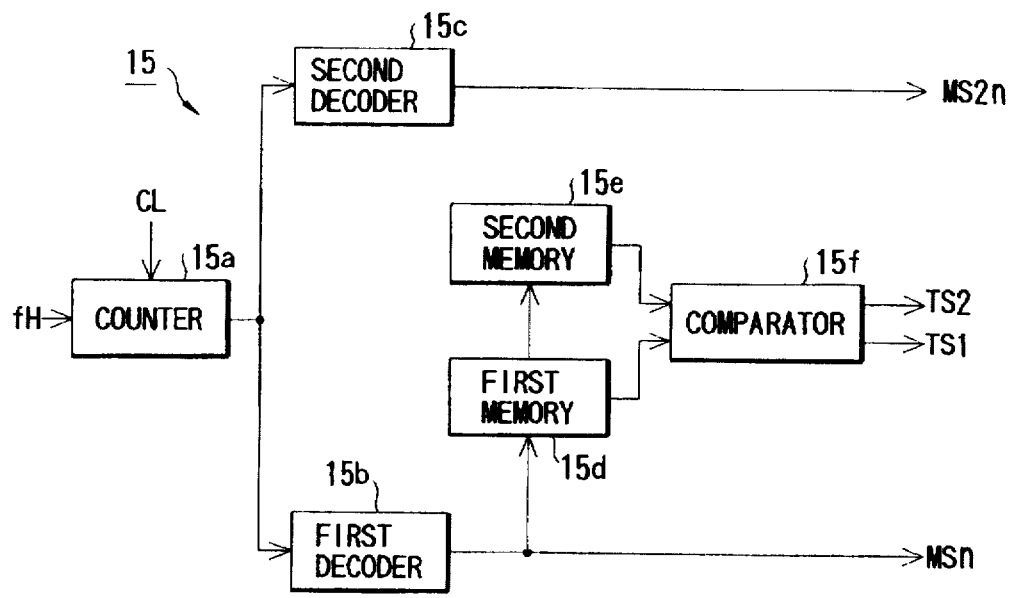
F I G. 11
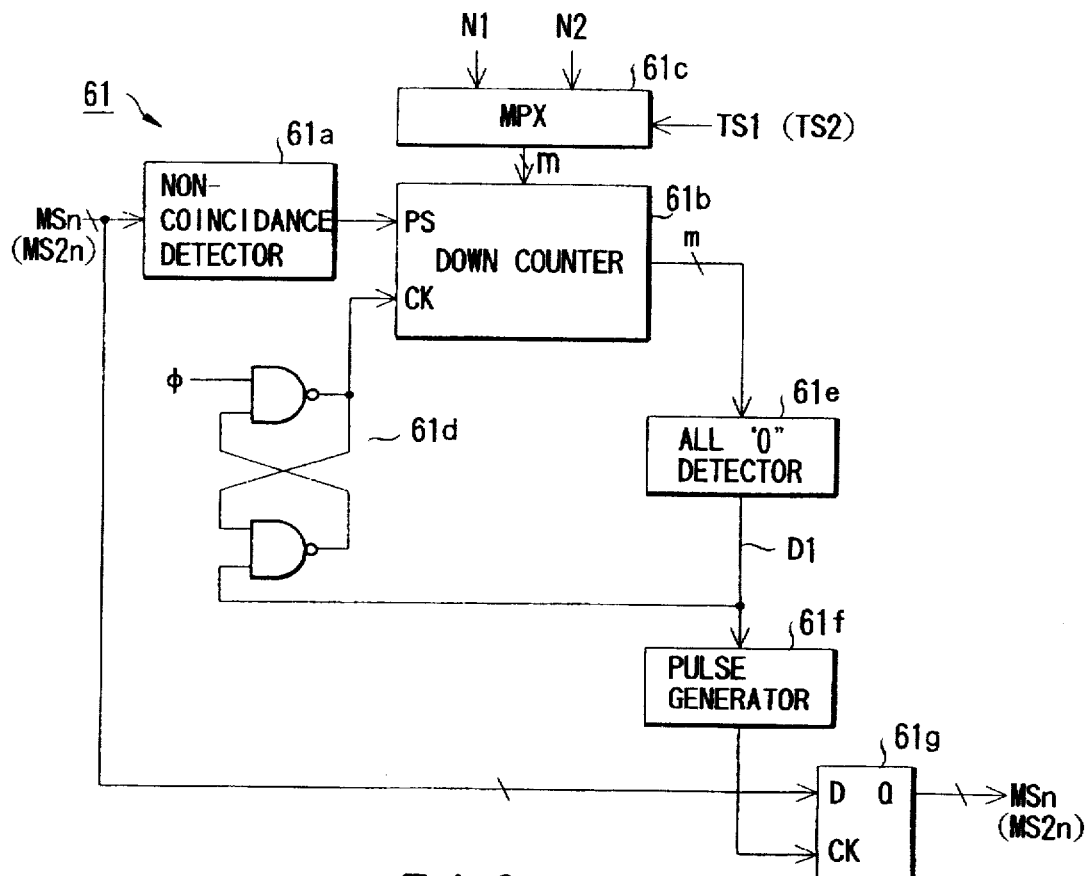
F I G. 12

HORIZONTAL OSCILLATION CIRCUIT CAPABLE OF CHANGING FREQUENCY

BACKGROUND OF THE INVENTION

1. Field of the Invention

The present invention relates to a semiconductor integrated circuit having an oscillation circuit and, more particularly, to a horizontal oscillation circuit which can change the frequency of a horizontal sync signal over a wide range and is applied to a monitor or a television receiver.

2. Description of the Related Art

A PLL (Phase Locked Loop) circuit is used as a horizontal oscillation circuit in a monitor used for, e.g., a computer, or a television receiver. This PLL circuit has a voltage-controlled oscillator (to be referred to as a VCO hereinafter) for generating a clock signal having a frequency n (n is an integer) times higher than the frequency of a horizontal sync signal.

Conventionally, the VCO is only required to generate clock signals of the same frequency. A recently developed monitor called a multi-scanning monitor can switch scanning speeds. The frequency of a horizontal sync signal supplied from a computer to a monitor of this type changes, for example, in the range of 20 kHz to 100 kHz. For this reason, a VCO applied to a horizontal oscillation circuit is required to be capable of oscillating over a wide range of the frequencies of horizontal sync signals.

If one VCO is made to oscillate over a wide frequency range, the VCO requires a high oscillation gain. If a high gain is set, the frequency response speed increases, resulting in a deterioration in jitter characteristics.

In order to solve this problem, a plurality of VCOs with different oscillation frequency ranges may be arranged such that the VCOs are switched to operate in accordance with the frequency of a horizontal sync signal. In this case, however, in addition to a plurality of VCOs, the oscillation circuit requires a frequency/voltage converter for generating a voltage corresponding to the frequency of a horizontal sync signal, resulting in an undesirable increase in circuit size.

SUMMARY OF THE INVENTION

It is an object of the present invention to provide a horizontal oscillation circuit which can prevent a deterioration in jitter characteristics by suppressing the oscillation gain of a VCO, and prevent an increase in circuit size.

In order to achieve the above object, there is provided a semiconductor integrated circuit having an oscillation circuit, comprising:

frequency detection means for detecting a frequency of a horizontal sync signal, the frequency detection means generating a switching signal in accordance with the detected frequency; and a voltage-controlled oscillator which has a plurality of oscillation modes obtained by dividing a frequency equal to an integer multiple of the frequency of the horizontal sync signal into a plurality of frequency ranges, and oscillates signals in the respective frequency ranges in accordance with control voltages, the oscillation modes of the voltage-controlled oscillator being switched in accordance with a switching signal output from the frequency detection means.

According to the present invention, signals in a wide frequency range can be oscillated by one voltage-controlled oscillator. In addition, since the frequency range in each oscillation mode of the voltage-controlled oscillator is narrow, the oscillation gain of the voltage-controlled oscillator can be decreased, and jitter can be reduced. Since the frequency detection circuit can be realized by a simple circuit, an increase in the overall circuit size can be suppressed.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram showing the arrangement of the first embodiment of the present invention;

FIG. 2 is a circuit diagram showing the detailed arrangement of a VCO in FIG. 1;

FIG. 3 is a graph for explaining the operation of the VCO in FIG. 2;

FIG. 4 is a circuit diagram showing an example of the ring oscillator in FIG. 2;

FIG. 5 is a circuit diagram showing another example of the ring oscillator in FIG. 2;

FIG. 6 is a circuit diagram showing an example of the loop filter in FIG. 1;

FIG. 7 is a circuit diagram showing still another example of the ring oscillator in FIG. 2;

FIG. 8 is a circuit diagram showing another example of the VCO in FIG. 1;

FIG. 11 is a block diagram showing the arrangement of another frequency detection circuit; and FIG. 12 is a block diagram showing the arrangement of a timer.

DETAILED DESCRIPTION OF THE PREFERRED EMBODIMENTS

Embodiments of the present invention will be described below with reference to the accompanying drawings.

FIG. 1 shows the first embodiment of the present invention. Referring to FIG. 1, a PLL circuit 16 is constituted by a phase comparator 11, a loop filter 12 as a low-pass filter, a VCO 13, and a frequency divider 14. A horizontal sync signal $f_H$ output from, e.g., a computer (not shown) and having a frequency which changes over a wide range is supplied to the first input terminal of the phase comparator 11. A reference signal $f_r$ output from the frequency divider 14 and having almost the same frequency as that of the horizontal sync signal $f_H$ is supplied to the second input terminal of the phase comparator 11. The phase comparator 11 detects the phase difference between the horizontal sync signal $f_H$ and the reference signal $f_r$. A signal corresponding to the detected phase difference is supplied to the loop filter 12. The loop filter 12 outputs a control voltage $V_L$ corresponding to the input signal. The control voltage $V_L$ is applied to the VCO 13. The VCO 13 generates a signal $nf_H$ in accordance with the control voltage $V_L$ applied from the loop filter 12. This signal $nf_H$ has a frequency n times (n is an integer) higher than the frequency of the horizontal sync signal $f_H$. As will be described later, the VCO 13 has a plurality of oscillation modes obtained by dividing a wide frequency range into a plurality of ranges. The oscillation frequency range in each oscillation mode is set to be narrow to decrease the oscillation gain. The signal $nf_H$ output from the VCO 13 is supplied to a horizontal drive circuit (not shown) and the frequency divider 14. The frequency divider 14 frequency-divides the period of the input signal to 1/n so as to generate the reference signal $f_r$.

Figure 10:
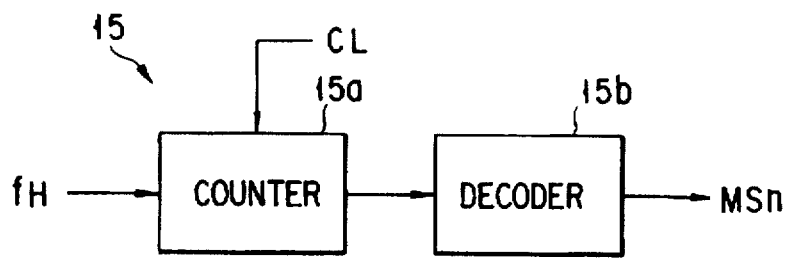
FIG. 10 is a block diagram showing the arrangement of a frequency detection circuit.

The horizontal sync signal $f_H$ and a clock signal CL are supplied to a frequency detection circuit 15. As shown in FIG. 10, the frequency detection n circuit 15 is constituted by a counter 15a for counting, e.g., clock signals CL, and a decoder 15b connected to the counter 15a. The counter 15a detects the frequency of the horizontal sync signal $f_H$ by counting clock signals CL in one period of the input horizontal sync signal $f_H$, i.e., a 1-H interval. The decoder 15b outputs a mode switching signal MSn (n=1 to 4) for switching the oscillation modes of the VCO 13 in accordance with the detected frequency. In this case, the decoder 15b sets one of mode switching signals MS1 to MS4 at high level in accordance with the detected frequency.

The mode switching signals MSn are appropriately set in each embodiment described later. That is, the arrangement of the decoder 15b is changed in each embodiment. For example, at least one of the mode switching signals MS1 to MS4 can be set at high level or low level in accordance with the detected frequency. A decoder of this type can be realized by a known technique using a logic circuit.

FIG. 2 shows an example of the VCO 13. This VCO 13 is constituted by a ring oscillator 20 and a selector 21. The ring oscillator 20 comprises an odd number of series-connected inverter circuit $20_1$ to $20_{n+1}$. The control voltage $V_L$ output from the loop filter 12 is applied to each of the inverter circuits $20_1$ to $20_{n+1}$.

The output terminals of the inverter circuits $20_{n-5}$, $20_{n-3}$, $20_{n-1}$, and $20_{n+1}$ are connected to the input terminals of the selector 21. The mode switching signal MSn output from the frequency detection circuit 15 is supplied to the selector 21. The selector 21 selects one of output signals from the inverter circuits $20_{n-5}$, $20_{n-3}$, $20_{n-1}$, and $20_{n+1}$ in accordance with the mode switching signal MSn. That is, the selector 21 switches the numbers of inverter circuits constituting the ring oscillator 20 to switch the oscillation modes in accordance with the mode switching signal MSn. The output signal from the selector 21 is supplied to the input terminal of the first inverter circuit $20_1$ of the selector 21. The oscillation modes of the VCO 13 are therefore switched in accordance with the mode switching signal MSn, and the signal $nf_H$ is output.

FIG. 3 shows the operation of the VCO 13. The oscillation modes of the VCO 13 are switched in accordance with the mode switching signals MS1 to MS4. In each oscillation mode, the VCO 13 oscillates at a predetermined frequency indicated by a solid line in accordance with the control voltage $V_L$ output from the loop filter 12.

FIG. 4 shows an inverter circuit as a part of the ring oscillator 20. A current path constituted by P-channel MOSFETs (to be referred to as PMOSs hereinafter) P1 and P2 and N-channel MOSFETs (to be referred to as NMOSs hereinafter) N1 and N2 is connected in series between a power supply Vdd and ground. The gates of the PMOSs P1 and P2 and the NMOSs N1 and N2 are commonly connected, and the node between the PMOS P2 and the NNOS N1 serves as an output terminal. PMOSs P3 and P4 are connected in parallel with the PMOS P1. The control voltage $V_L$ output from the loop filter 12 is applied to the gates of the PMOSs P3 and P4. The currents flowing in the PMOSs P3 and P4 change in accordance with the control voltage $V_L$. The current flowing in the PMOS P1 therefore changes in accordance with the control voltage $V_L$. That is, the dimension of the PMOS P1 is changed in accordance with the control voltage $V_L$, and the oscillation frequency of the ring oscillator 20 is changed in accordance with this change in dimension.

According to the above embodiment, the VCO 13 is constituted by the ring oscillator 20 having a plurality of inverter circuits connected in series, and switches the numbers of inverter circuits constituting the ring oscillator 20 in accordance with the frequency of the horizontal sync signal $f_H$ detected by the frequency detection circuit 15, thereby switching the oscillation modes. In each oscillation mode, the oscillation frequency of the VCO 13 is changed in accordance with the control voltage $V_L$. Therefore, signals having frequencies in a wide range can be oscillated by using one VCO 13. In addition, as indicated by the solid lines in FIG. 3, the frequency ranges in the respective oscillation modes are narrow. For this reason, the oscillation gain of the VCO 13 can be decreased as compared with the case wherein the frequency range is wide as indicated by the dotted line in FIG. 3, and hence jitter can be reduced.

Furthermore, a plurality of VCOs are not required but only the VCO 13 is required, unlike the conventional oscillation circuit. In addition, since a frequency detection circuit can be realized by a simple circuit, the circuit size is smaller than that of a conventional frequency/voltage converter. An increase in the overall circuit size can therefore be suppressed.

FIG. 5 shows another inverter circuit as a part of the ring oscillator 20. The same reference numerals in FIG. 5 denote the same parts as in FIG. 4, and only a different portion will be described. In this case, NMOSs N3 and N4 are connected in parallel with the NMOS N2. In addition, a control voltage $V_{L1}$ output from the output terminal of the loop filter 12 is applied to the gates of the PMOSs P3 and P4, whereas a control voltage $V_{L2}$ output from the input terminal of the loop filter 12 (the output voltage from the phase comparator 11) is applied to the gates of the NMOSs N3 and N4.

FIG. 6 shows an example of the loop filter 12. The loop filter 12 comprises a differential amplifier 31 and resistors 32, 33, 34, and 35. That is, the output terminal of the phase comparator 11 is connected to the non-inverting input terminal of the differential amplifier 31 through the resistor 32. The resistor 33 is connected between this non-inverting input terminal and the output terminal of the differential amplifier 31. The resistors 34 and 35 are connected in series between a power supply Vdd and ground. The node between the resistors 34 and 35 is connected to the inverting input terminal of the differential amplifier 31. The control voltage $V_{L1}$ is output from the output terminal of the differential amplifier 31. The control voltage $V_{L2}$ is output from the output terminal of the phase comparator 11.

When, for example, the phase of the horizontal sync signal $f_H$ leads the phase of the reference signal $f_r$, the phase comparator 11 outputs a high-level signal. When the phase of the horizontal sync signal $f_H$ lags behind the phase of the reference signal $f_r$, the phase comparator 11 outputs a low-level signal. When the horizontal sync signal $f_H$ is in phase with the reference signal $f_r$, a high-impedance state is set.

The inverter circuit shown in FIG. 5 switches the dimensions of the PMOSs and the NMOSs in accordance with the control voltages $V_{L1}$ and $V_{L2}$ from the loop filter 12, thereby switching the oscillation frequencies of the VCO 13. With this arrangement, the oscillation frequency range can be broadened.

In the above embodiment, a fixed voltage may be applied to the gates of the NMOSs N3 and N4 instead of applying the control voltage $V_{L2}$. In this case, noise can be reduced.

FIG. 7 shows still another inverter circuit as a part of the ring oscillator 20. The same reference numerals in FIG. 7 denote the same parts as in FIG. 6, and only a different portion will be described. In this case, a plurality of PMOSs P5, P6, P7, and P8 are connected to the PMOS P1. The mode switching signals MS1, MS2, MS3, and MS4 output from the frequency detection circuit 15 are respectively supplied to the gates of the PMOSs P5, P6, P7, and P8. In addition, the control voltage $V_L$ from the loop filter 12 is applied to the gates of the NMOSs N3 and N4. In this case, the frequency detection circuit 15 sets at least one of the mode switching signals MS1 to MS4 at high level in accordance with the detected frequency.

The dimensions of the PMOS P1 are switched by changing the number of ON transistors among the NMOSs P5, P6, P7, and P8 by the mode switching signal MS1, MS2, MS3, or MS4. By switching the dimensions of the PMOS P1, the oscillation modes of the VCO are switched. If the inverter circuits constituting the ring oscillator 20 are arranged in the above manner, the selector 21 in FIG. 2 can be omitted. Therefore, the circuit may be designed such that the output signal from the last inverter circuit is fed back to the input terminal of the first inverter circuit.

FIG. 8 shows another example of the VCO 13. In the example shown in FIG. 2, the ring oscillator is constituted by a plurality of inverter circuits. In this example, the ring oscillator is constituted by an odd number of series-connected differential amplifiers $51_1$ to $51_n$ and $51_{n+1}$ and a selector 52. The control voltages $V_{L1}$ and $V_{L2}$ are applied to the differential amplifiers $51_1$ to $51_n$ and $51_{n+1}$.

The selector 52 selects one of the output signals from the differential amplifiers $51_n$ and $51_{n+1}$ in accordance with the mode switching signal MSn. When the selector 52 selects the output signal from an odd-numbered differential amplifier, the non-inverting and inverting output signals from this differential amplifier are respectively supplied to the non-inverting and inverting input terminals of the differential amplifier $51_1$. When the selector 52 selects the output signal from an even-numbered differential amplifier, the inverting and non-inverting output signals from this differential amplifier are respectively supplied to the non-inverting and inverting input terminals of the differential amplifier $51_1$.

With the VCO shown in FIG. 8, the same effects as those of the above embodiment can be obtained. In addition, each differential amplifier has a constant current source (not shown). For this reason, the differential amplifier suffers less noise upon switching and with variations in power supply than the inverter. Therefore, the ring oscillator using differential amplifiers is superior in jitter characteristics to the ring oscillator using inverter circuits.

Figure 9:
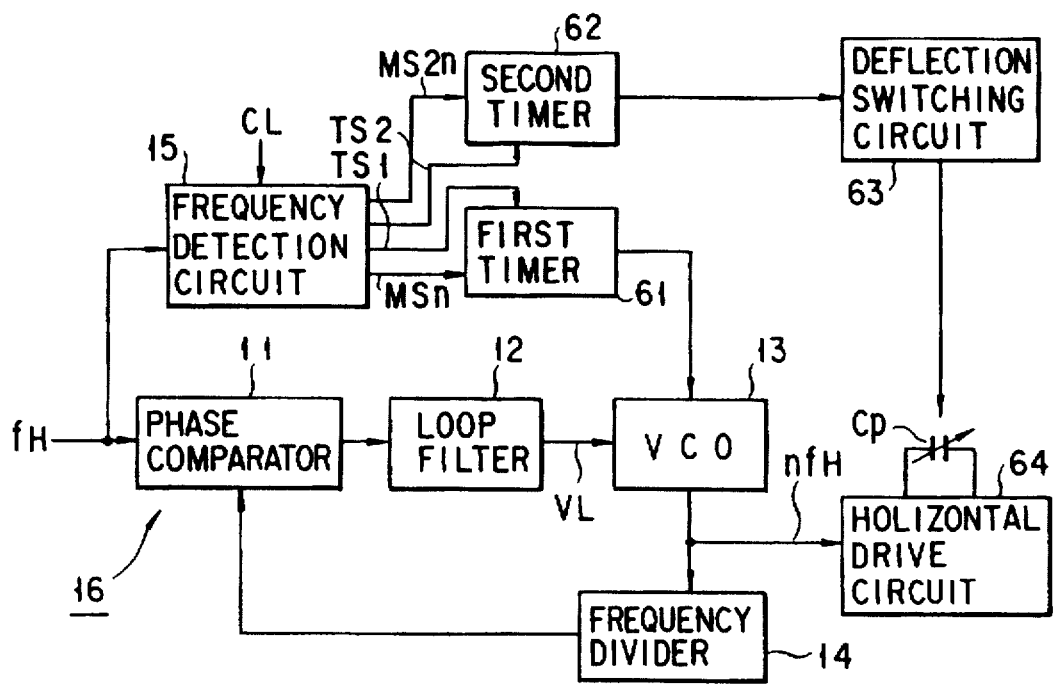
FIG. 9 is a block diagram showing the arrangement of the second embodiment of the present invention.

FIG. 9 shows the second embodiment of the present invention. The same reference numerals in FIG. 9 denote the same parts as in FIG. 1. In this embodiment, the timing at which the oscillation modes of a VCO are switched and the timing at which the horizontal linearity of a horizontal drive circuit is compensated are changed in accordance with the frequency of a horizontal sync signal.

Referring to FIG. 9, an output terminal of the frequency detection circuit 15 is connected to the VCO 13 through a first timer 61, and another output terminal of the frequency detection circuit 15 is also connected to a deflection switching circuit 63 through a second timer 62. An output signal $nf_H$ from the VCO 13 is supplied to a horizontal drive circuit 64. The deflection switching circuit 63 is connected to the horizontal drive circuit 64. The horizontal drive circuit 64 includes a capacitor Cp whose capacitance can be changed. By changing the capacitance of the capacitor Cp, the horizontal linearity can be compensated. The deflection switching circuit 63 changes the capacitance of the capacitor Cp in the horizontal drive circuit 64 in accordance with the frequency of a horizontal sync signal. The frequency detection circuit 15, the PLL circuit 16, and the first and second timers 61 and 62, excluding the deflection switching circuit 63 and the horizontal drive circuit 64, are formed into an integrated circuit.

The frequency detection circuit 15 outputs a mode switching signal Msn for controlling the VCO 13, a control signal MS2n for controlling the deflection switching circuit 63, and control signals TS1 and TS2 for controlling the first and second timers 61 and 62. The control signals TS1 and TS2 are complementary signals. Each of the first and second timers 61 and 62 is set in the first or second operation mode in accordance with a corresponding one of the control signals TS1 and TS2. When the first and second timers 61 and 62 are set in the first operation mode, the timers immediately output input signals. When the first and second timers 61 and 62 are set in the second operation mode, the timers output input signals with delays of 100 to 200 ns.

When the frequency of a horizontal sync signal is switched from a low frequency to a high frequency, the first timer 61 is set in the first operation mode, and the second timer 62 is set in the second operation mode in accordance with the control signals TS1 and TS2. First of all, therefore, the mode switching signal MSn is supplied to the VCO 13 through the first timer 61 to increase the oscillation frequency of the VCO 13. Thereafter, the control signal MS2n is supplied to the deflection switching circuit 63 through the second timer 62. The capacitances of the capacitor Cp in the horizontal drive circuit 64 are switched by the deflection switching circuit 63.

When the frequency of a horizontal sync signal is switched from a high frequency to a low frequency, the first and second timers 61 and 62 are respectively set in the second operation mode and the first operation mode in accordance with the control signals TS1 and TS2. First of all, therefore, the control signal MS2n is supplied to the deflection switching circuit 63 through the second timer 62, and the capacitances of the capacitor Cp in the horizontal drive circuit 64 are switched by the deflection switching circuit 63. Thereafter, the mode switching signal MSn is supplied to the VCO 13 through the first timer 61 so as to decrease the oscillation frequency of the VCO 13.

FIG. 11 shows the frequency detection circuit 15. For example, the frequency detection circuit 15 is constituted by a counter 15a, first and second decoders 15b and 15c, first and second memories 15d and 15e, and a comparator 15f. The counter 15a and the first decoder 15b are the same as those in FIG. 10. The second decoder 15c is connected to the output terminal of the counter 15a. The second decoder 15c generates the control signal MS2n for switching the capacitances of the capacitor Cp in the horizontal drive circuit 64 in accordance with the frequency of a horizontal sync signal output from the counter 15a.

The first and second memories 15d and 15e are sequentially connected to the output terminal of the first decoder 15b. The first memory 15d stores the current mode switching signal output from the first decoder 15b. The second memory 15e stores the preceding mode switching signal.

The data stored in the first and second memories 15d and 15e are updated when the mode switching signal output from the first decoder 15b changes. The first and second memories 15d and 15e are connected to the input terminals of the comparator 15f. The comparator 15f compares the mode switching signal stored in the first memory 15d with the mode switching signal stored in the second memory 15e, and outputs the control signals TS1 and TS2 in accordance with the comparison result. That is, the comparator 15f can recognize in accordance with this comparison result whether the frequency of a horizontal sync signal is switched from a low frequency to a high frequency or from a high frequency to a low frequency. When the frequency of the horizontal sync signal is switched from a low frequency to a high frequency, the comparator 15f sets the control signals TS1 and TS2 at, for example, low level and high level, respectively. When the frequency of the horizontal sync signal is switched from a high frequency to a low frequency, the comparator 15f sets the control signals TS1 and TS2 at high level and low level, respectively.

FIG. 12 shows the arrangement of the first timer 61. Since the second timer 62 has the same arrangement as that of the first timer 61, a description thereof will be omitted. The mode switching signal MSn (the control signal MS2n in the case of the second timer) is supplied to a non-coincidence detector 61a. The non-coincidence detector 61a is constituted by a plurality of exclusive OR circuits, for example. When the mode switching signal MSn changes, the non-coincidence detector 61a output a signal. For example, the output signal from the non-coincidence detector 61a is supplied to a preset terminal PS of a preset type down counter 61b.

The output terminal of a multiplexer (MPX) 61c is connected to the down counter 61b. Time data N1 and N2 are supplied to input terminals of the multiplexer 61c. The time data N1 is a numerical value for setting a delay time of, e.g., 0 ns. The time data N2 is a numerical value for setting a delay time of, e.g., 100 to 200 ns. The multiplexer 61c selects one of the time data N1 and N2 in accordance with the control signal TS1, and supplies the selected data to the down counter 61b. The down counter 61b sets the time data output from the multiplexer 61c when a signal output from the non-coincidence detector 61a is supplied to the preset terminal PS.

A clock signal ø is supplied to a clock input terminal CK of the down counter 61b through a flip-flop circuit 61d. The down counter 61b counts down the set time data in accordance with the clock signal ø. Output signals of the down counter 61b are supplied to an all "0" detector 61e. When the output signals from the down counter 61b becomes all "0", the detector 61e outputs a high-level signal D1. This signal D1 is supplied to the flip-flop circuit 61d and a pulse generator 61f. The flip-flop circuit 61d is reset by the signal D1. As a result, supply of the clock signal ø to the down counter 61b is stopped. The pulse generator 61f generates a pulse signal in accordance with the signal D1, and supplies this pulse signal to a clock input terminal CK of a flip-flop circuit 61g. The mode switching signal MSn has been supplied to a data input terminal of the flip-flop circuit 61g. Upon reception of a pulse signal from the pulse generator 61f, the flip-flop circuit 61g outputs the mode switching signal MSn.

In the above arrangement, when time data corresponding to a delay time of 0 ns is set in the down counter 61b, the all "0" detector 61e immediately outputs the signal D1. As a result, in response to the pulse signal supplied from the pulse generator 61f, the flip-flop circuit 61g immediately outputs the mode switching signal MSn. If time data corresponding to a delay time of 100 to 200 ns is set in the down counter 61b, the all "0" detector 61e outputs the signal D1 when the down counter 61b finishes counting the set numerical value. As a result, in response to the pulse signal supplied from the pulse generator 61f, the flip-flop circuit 61g outputs the mode switching signal MSn after a lapse of 100 ns to 200 ns.

According to this embodiment, oscillation modes can be digitally set. In addition, by delaying a mode switching signal output from the frequency detection circuit 15 by a predetermined period of time using the first and second timers 61 and 62, a time difference can be set between the timing at which the oscillation frequencies of the VCO 13 are switched and the timing at which the capacitances of the capacitor in the horizontal drive circuit 64 are switched, when the frequency of a horizontal sync signal is switched. Therefore, the load on the horizontal drive circuit in a transient period during which the frequency of a horizontal sync signal is switched to another frequency can be reduced.

As is apparent, various changes and modifications of the embodiments can be made without departing from the spirit and scope of the invention.

What is claimed is:

1. A semiconductor integrated circuit having an oscillation circuit, comprising:

frequency detection means for detecting a frequency of a horizontal sync signal, the frequency changing over a wide range, said frequency detection means generating a switching signal in accordance with the detected frequency; and a voltage-controlled oscillator which has a plurality of oscillation modes obtained by dividing a frequency equal to an integer multiple of the frequency of the horizontal sync signal into a plurality of frequency ranges, and oscillates signals in the respective frequency ranges in accordance with control voltages, the oscillation modes of said voltage-controlled oscillator being switched in accordance with a switching signal output from said frequency detection means.

2. A circuit according to claim 1, wherein said voltage-controlled oscillator comprises:

an odd number of series-connected inverter circuits; and selection means for selecting one of a plurality of output signals from said inverter circuits in accordance with the switching signal, said selection means supplying the selected output signal to the first inverter circuit.

3. A circuit according to claim 2, wherein each of said inverter circuits has a transistor whose current amounts are switched in accordance with the control voltage.

4. A circuit according to claim 1, wherein said voltage-controlled oscillator comprises an odd number of series-connected inverter circuits, each of said inverter circuits having a transistor whose current amounts are switched in accordance with the switching signal.

5. A circuit according to claim 1, wherein said voltage-controlled oscillator comprises:

an odd number of series-connected differential amplification circuits; and selection means for selecting one of a plurality of output signals from said differential amplification circuits in accordance with the switching signal, and wherein said selection means respectively supplies non-inverting and inverting output signals from said differential amplification circuit to non-inverting and inverting input terminals of the first differential amplification circuit when said selection means selects an output signal from an odd-numbered differential amplification circuit, and said selection means respectively supplies non-inverting and non-inverting output signals from said differential amplification circuit to non-inverting and inverting input terminals of the first differential amplification circuit when said selection means selects an output signal from an even-numbered differential amplification circuit.

6. A circuit according to claim 1, wherein said frequency detecting means comprises:

a counter for counting clock signals in one period of the horizontal sync signal, and outputting a counting result; and a decoder for decoding the counting result from said counter, and outputting said switching signal.

7. A semiconductor integrated circuit having an oscillation circuit, comprising:

frequency detection means for detecting a frequency of a horizontal sync signal, the frequency changing over a wide range, said frequency detection means generating a switching signal in accordance with the detected frequency;

a phase comparing circuit for comparing a phase of the horizontal sync signal with a phase of a reference signal, said phase comparing circuit outputting a signal corresponding to a phase difference between the horizontal sync signal and the reference signal;

a filter circuit to which the output signal from said phase comparing circuit is supplied, said filter circuit generating a control voltage from the output signal;

a voltage-controlled oscillator which has a plurality of oscillation modes obtained by dividing a frequency equal to an integer multiple of the frequency of the horizontal sync signal into a plurality of frequency ranges, and oscillates signals in the respective frequency ranges in accordance with control voltages applied from said filter circuit, the oscillation modes of said voltage-controlled oscillator being switched in accordance with a switching signal output from said frequency detection means; and frequency dividing means for frequency-dividing an output signal from said voltage-controlled oscillator, said frequency dividing means generating the reference signal.

8. A circuit according to claim 7, wherein said voltage-controlled oscillator comprises:

an odd number of series-connected inverter circuits; and selection means for selecting one of a plurality of output signals from said inverter circuits in accordance with the switching signal, said selection means supplying the selected output signal to the first inverter circuit.

9. A circuit according to claim 8, wherein each of said inverter circuits has a transistor whose current amounts are switched in accordance with the control voltage.

10. A circuit according to claim 7, wherein said voltage-controlled oscillator comprises an odd number of series-connected inverter circuits, each of said inverter circuits having a transistor whose current amounts are switched in accordance with the switching signal.

11. A circuit according to claim 7, wherein said voltage-controlled oscillator comprises:

an odd number of series-connected differential amplification circuits; and wherein said selection means respectively supplies non-inverting and inverting output signals from said differential amplification circuit to non-inverting and inverting input terminals of the first differential amplification circuit when said selection means selects an output signal from an odd-numbered differential amplification circuit, and said selection means respectively supplies inverting and non-inverting output signals from said differential amplification circuit to non-inverting and inverting input terminals of the first differential amplification circuit when said selection means selects an output signal from an even-numbered differential amplification circuit.

12. A circuit according to claim 7, wherein said frequency detection means comprises:

a counter for counting clock signals in one period of the horizontal sync signal, and outputting a counting result; and a decoder for decoding the counting result from said counter, and outputting said switching signal.

13. A semiconductor integrated circuit having an oscillation circuit, comprising:

frequency detection means for detecting a frequency of a horizontal sync signal, said frequency detection means generating a switching signal in accordance with the detected frequency;

a phase comparing circuit for comparing a phase of the horizontal sync signal with a phase of a reference signal, said phase comparing circuit outputting a signal corresponding to a phase difference between the horizontal sync signal and the reference signal;

a filter circuit to which the output signal from said phase comparing circuit is supplied, said filter circuit generating a control voltage from the output signal;

a voltage-controlled oscillator which has a plurality of oscillation modes obtained by dividing a frequency equal to an integer multiple of the frequency of the horizontal sync signal into a plurality of frequency ranges, and oscillates signals in the respective frequency ranges in accordance with control voltages applied from said filter circuit, the oscillation modes of said voltage-controlled oscillator being switched in accordance with a switching signal output from said frequency detection means;

frequency dividing means for frequency-dividing an output signal from said voltage-controlled oscillator, said frequency dividing means generating the reference signal;

a horizontal drive circuit to which an output signal from said voltage-controlled oscillator is supplied to generate a horizontal drive pulse signal;

a deflection switching circuit for switching capacities of said horizontal drive circuit in accordance with the switching signal output from said frequency detection means; and a setting circuit for setting an operation sequence of said voltage-controlled oscillator and said deflection switching circuit in accordance with the switching signal output from said frequency detection means.

14. A circuit according to claim 13, wherein said setting circuit switches an oscillation frequency of said voltage-controlled oscillator and then switches said capacitors of the horizontal drive circuit by said deflection switching circuit when a frequency of a horizontal sync signal detected by said frequency detection circuit is switched to a higher frequency, and switches said capacitors of the horizontal drive circuit by said deflection switching circuit and then switches the oscillation frequency of said voltage-controlled oscillator when the frequency of the horizontal sync signal is switched to a lower frequency.

15. A circuit according to claim 14, wherein said setting circuit comprises a timer circuit.

16. A circuit according to claim 13, wherein said voltage-controlled oscillator comprises:

an odd number of series-connected inverter circuits; and selection means for selecting one of a plurality of output signals from said inverter circuits in accordance with the switching signal, said selection means supplying the selected output signal to the first inverter circuit.

17. A circuit according to claim 16, wherein each of said inverter circuits has a transistor whose current amounts are switched in accordance with the control voltage.

18. A circuit according to claim 17, wherein said voltage-controlled oscillator comprises an odd number of series-connected inverter circuits, each of said inverter circuits having a transistor whose current amounts are switched in accordance with the switching signal.

19. A circuit according to claim 13, wherein said voltage-controlled oscillator comprises:

an odd number of series-connected differential amplification circuits; and selection means for selecting one of a plurality of output signals from said differential amplification circuits in accordance with the switching signal, and wherein said selection means respectively supplies non-inverting and inverting output signals from said differential amplification circuit to non-inverting and inverting input terminals of the first differential amplification circuit when said selection means selects an output signal from an odd-numbered differential amplification circuit, and said selection means respectively supplies inverting and non-inverting output signals from said differential amplification circuit to non-inverting and inverting input terminals of the first differential amplification circuit when said selection means selects an output signal from an even-numbered differential amplification circuit.

20. A semiconductor integrated circuit having an oscillation circuit, comprising:

frequency detection means for detecting a frequency of a horizontal sync signal, the frequency changing over a wide range, said frequency detection means generating a switching signal in accordance with the detected frequency; and a PLL circuit for oscillating a signal in accordance with the frequency of the horizontal sync signal, said PLL circuit having a voltage-controlled oscillator which has a plurality of oscillation modes obtained by dividing a frequency equal to an integer multiple of the frequency of the horizontal sync signal into a plurality of frequency ranges, the oscillation modes being switched in accordance with a switching signal output from said frequency detection means, and said voltage-controlled oscillator oscillating a signal in each of the frequency ranges in accordance with a control voltage.

21. A circuit according to claim 20, wherein said frequency detection means comprises:

a counter for counting clock signals in one period of the horizontal sync signal, and outputting a counting result; and a decoder for decoding the counting result from said counter, and outputting said switching signal.

22. A semiconductor integrated circuit having an oscillation circuit, comprising:

frequency detection means for detecting a frequency of an input signal, the frequency changing over a wide range, said frequency detection means generating a control signal in accordance with the detected frequency; and a voltage-controlled oscillator for oscillating a signal having a wide range frequency approximately equal to said frequency of said input signal, and selectively outputting an oscillated signal in accordance with said control signal applied from said frequency detection means.

23. A semiconductor integrated circuit having an oscillation circuit, comprising:

frequency detection means for detecting a frequency of an input signal, the frequency changing over a wide range, said frequency detection means generating a control signal in accordance with the detected frequency;

a phase comparing circuit for comparing a phase of the input signal with a phase of a reference signal, said phase comparing circuit outputting a signal corresponding to a phase difference between the input signal and the reference signal;

a filter circuit for generating a control voltage from the output signal which is supplied from said phase comparing circuit;

a voltage-controlled oscillator for oscillating a signal having a wide range frequency approximately equal to said frequency of said input signal in accordance with the control voltage applied from said filter circuit, and selectively outputting an oscillated signal in accordance with said control signal applied from said frequency detection means; and frequency dividing means for frequency-dividing an output signal from said voltage-controlled oscillator, said frequency dividing means generating the reference signal, and supplying the reference signal to said phase comparing circuit.

* * * * *